(12) United States Patent
Choi et al.

(10) Patent No.: US 9,542,892 B2
(45) Date of Patent: Jan. 10, 2017

(54) ORGANIC LIGHT-EMITTING DIODE DISPLAY WITH REDUCED LATERAL LEAKAGE

(71) Applicant: Apple Inc., Cupertino, CA (US)

(72) Inventors: Jae Won Choi, Cupertino, CA (US); John Z. Zhong, Saratoga, CA (US); Kwang Ohk Cheon, Sunnyvale, CA (US); Shih Chang Chang, Cupertino, CA (US); Young Bae Park, San Jose, CA (US)

(73) Assignee: Apple, Inc., Cupertino, CA (US)

( * ) Notice: Subject to any disclaimer, the term of this patent is extended or adjusted under 35 U.S.C. 154(b) by 45 days.

(21) Appl. No.: 14/747,719

(22) Filed: Jun. 23, 2015

(65) Prior Publication Data

US 2015/0379938 A1    Dec. 31, 2015

Related U.S. Application Data

(60) Provisional application No. 62/017,096, filed on Jun. 25, 2014.

(51) Int. Cl.
*G09G 3/32* (2016.01)
*H01L 51/50* (2006.01)
*H01L 27/32* (2006.01)

(52) U.S. Cl.
CPC .......... *G09G 3/3291* (2013.01); *G09G 3/3233* (2013.01); *G09G 2300/0426* (2013.01); *G09G 2300/0861* (2013.01); *G09G 2310/0251* (2013.01); *G09G 2320/0209* (2013.01); *G09G 2320/043* (2013.01); *H01L 27/3276* (2013.01); *H01L 51/5088* (2013.01)

(58) Field of Classification Search
CPC .......... G09G 3/32; G09G 3/3275; G09G 3/34; G09G 3/348; G09G 3/3625; G09G 3/3674; G09G 3/3685; G09G 3/38; G09G 5/003
See application file for complete search history.

(56) References Cited

U.S. PATENT DOCUMENTS

| | | | |
|---|---|---|---|
| 6,657,305 B1 * | 12/2003 | Cohen | H01L 21/76829 257/773 |
| 7,977,126 B2 | 7/2011 | Lee et al. | |
| 8,076,669 B2 | 12/2011 | Kang et al. | |
| 8,916,859 B2 | 12/2014 | Kim et al. | |

(Continued)

*Primary Examiner* — Olga Merkoulova
(74) *Attorney, Agent, or Firm* — Treyz Law Group, P.C.; G. Victor Treyz; Michael H. Lyons

(57) ABSTRACT

A display may have an array of pixels. Each pixel may have a light-emitting diode that emits light under control of a drive transistor. The organic light-emitting diodes may have a common cathode layer, a common electron layer, individual red, green, and blue emissive layers, a common hole layer, and individual anodes. The hole layer may have a hole injection layer stacked with a hole transport layer. Pixel circuits for controlling the diodes may be formed from a layer of thin-film transistor circuitry on a substrate. A planarization layer may cover the thin-film transistor layer. Lateral leakage current between adjacent diodes can be blocked by shorting the common hole layer to a metal line such as a bias electrode that is separate from the anodes. The metal line may be laterally interposed between adjacent pixels and may be formed on the planarization layer or embedded within the planarization layer.

20 Claims, 5 Drawing Sheets

(56) References Cited

U.S. PATENT DOCUMENTS 8,940,553 B2 * 1/2015 Lee .................. H01L 22/32
  257/48
2014/0048795 A1 2/2014 Kim et al.

* cited by examiner

ORGANIC LIGHT-EMITTING DIODE DISPLAY WITH REDUCED LATERAL LEAKAGE

This application claims the benefit of provisional patent application No. 62/017,096 filed on Jun. 25, 2014, which is hereby incorporated by reference herein in its entirety.

BACKGROUND

This relates generally to electronic devices with displays and, more particularly, to displays such as organic-light-emitting diode displays.

Electronic devices often include displays. For example, cellular telephones and portable computers include displays for presenting information to users.

Displays such as organic light-emitting diode displays have arrays of pixels based on light-emitting diodes. In this type of display, each pixel includes a light-emitting diode and thin-film transistors for controlling application of a signal to the light-emitting diode to produce light. The light-emitting diodes may be provided with emissive materials of different colors to create color images The emissive materials may, for example, include red emissive material for forming red diodes in red pixels, green emissive material for forming green diodes in green pixels, and blue emissive material for forming blue diodes in blue pixels.

During fabrication, some of the layers of material that are used in forming the organic light-emitting diodes are deposited in the form of blanket films that cover the entire display. For example, a display may include a common hole layer formed from a blanket hole injection layer stacked with a blanket hole transport layer. Due to doping levels in the hole layer, it is possible for currents to leak laterally between adjacent pixels during operation of a display. For example, when a blue diode is being turned on and an adjacent red diode is being turned off, there is a potential for leakage current to laterally flow in the hole layer between an anode in the blue diode and an anode in the red diode. This can cause the red diode to turn on inadvertently.

It would therefore be desirable to be able to provide displays such as organic light-emitting diode displays that exhibit reduced lateral leakage currents.

SUMMARY

A display may have an array of organic light-emitting diode pixels. Each pixel may have a light-emitting diode that emits light under control of a drive transistor. The organic light-emitting diodes may have a common cathode layer, a common electron layer, individual red, green, and blue emissive layers, a common hole layer, and individual anodes. The common hole layer may have a hole injection layer stacked with a hole transport layer.

Pixel circuits for controlling the drive transistors may be formed from a layer of thin-film transistor circuitry on a substrate. A planarization layer may cover the thin-film transistor layer. Lateral leakage current between adjacent diodes can be blocked by shorting the common hole layer to a metal line such as a bias path that is separate from the anodes. The bias path may be laterally interposed between adjacent pixels and may be formed on the planarization layer or embedded within the planarization layer.

During operation, the anodes may be driven at positive voltages and the cathode layer may be maintained at a ground voltage. The bias path may be maintained at a voltage less than the ground voltage.

DETAILED DESCRIPTION

Figure 1:
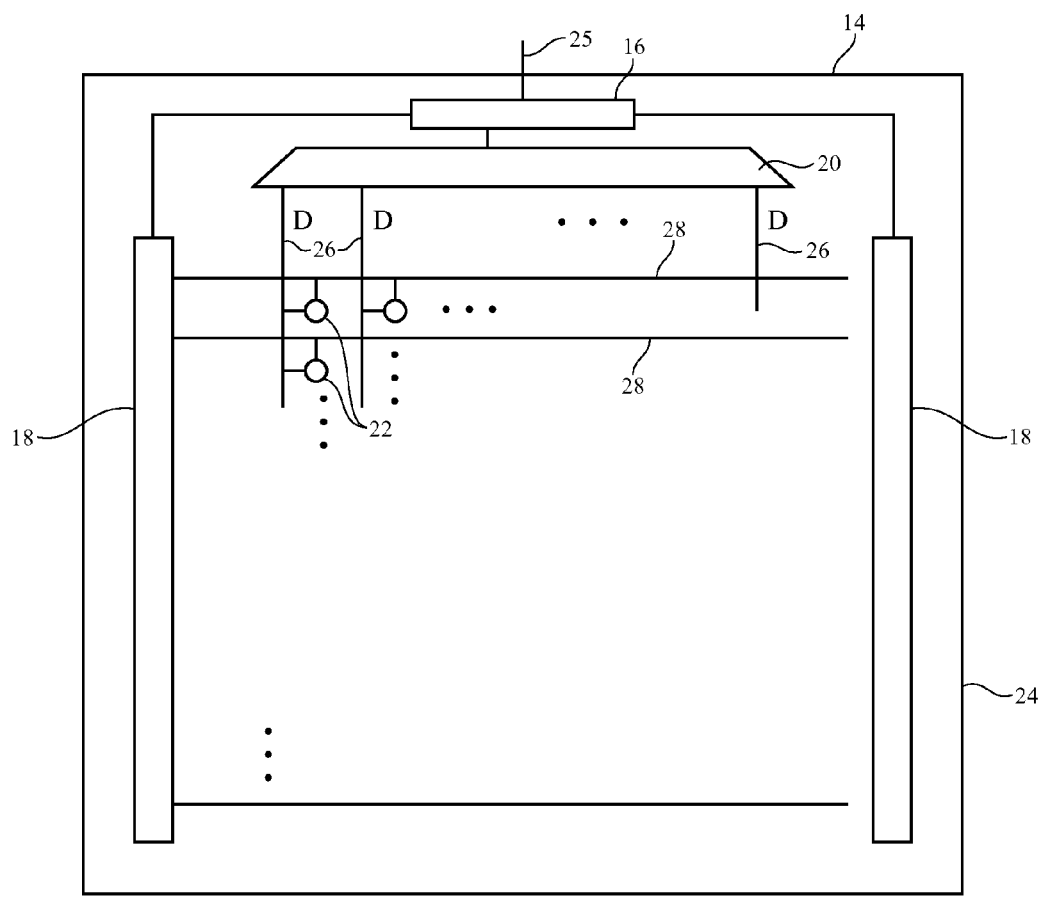
FIG. 1 is a diagram of an illustrative display such as an organic light-emitting diode display having an array of organic light-emitting diode display pixels in accordance with an embodiment.

A display in an electronic device may be provided with driver circuitry for displaying images on an array of pixels. An illustrative display is shown in FIG. 1. As shown in FIG. 1, display 14 may have one or more layers such as substrate 24. Layers such as substrate 24 may be formed from planar rectangular layers of material such as planar glass layers. Display 14 may have an array of pixels 22 for displaying images for a user. The array of pixels 22 may be formed from rows and columns of pixel structures on substrate 24. These structures may include thin-film transistors such as polysilicon thin-film transistors, semiconducting oxide thin-film transistors, etc. There may be any suitable number of rows and columns in the array of pixels 22 (e.g., ten or more, one hundred or more, or one thousand or more).

Display driver circuitry such as one or more display driver integrated circuits may be coupled to conductive paths such as metal traces on substrate 24 using solder or conductive adhesive. Display driver circuits such as display driver integrated circuit 16 may contain communications circuitry for communicating with system control circuitry over path 25. Path 25 may be formed from traces on a flexible printed circuit or other cable. The control circuitry may be located on a main logic board in an electronic device such as a cellular telephone, computer, television, set-top box, media player, portable electronic device, or other electronic equipment in which display 14 is being used. During operation, the control circuitry may supply display driver integrated circuit 16 with information on images to be displayed on display 14. To display the images on display pixels 22, display driver integrated circuit 16 may supply clock signals and other control signals to display driver circuitry such as row driver circuitry 18 and column driver circuitry 20. Row driver circuitry 18 and/or column driver circuitry 20 may be formed from one or more integrated circuits and/or one or more thin-film transistor circuits.

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines or scan lines). Row driver circuitry may sometimes be referred to as scan line driver circuitry or gate line driver circuitry.

Column driver circuitry 20 may be used to provide data signals D from display driver integrated circuit 16 onto a plurality of corresponding vertical lines 26. Column driver circuitry 20 may sometimes be referred to as data line driver circuitry or source driver circuitry. Vertical lines 26 are sometimes referred to as data lines. During compensation operations, column driver circuitry 20 may use vertical lines 26 to supply a reference voltage. During programming operations, display data is loaded into display pixels 22 using lines 26.

Each data line 26 is associated with a respective column of display pixels 22. Sets of horizontal signal lines 28 run horizontally through display 14. Each set of horizontal signal lines 28 is associated with a respective row of display pixels 22. The number of horizontal signal lines in each row is determined by the number of transistors in the pixels 22 that are being controlled independently by the horizontal signal lines. Display pixels of different configurations may be operated by different numbers of scan lines.

Row driver circuitry 18 may assert control signals such as scan signals on the row lines 28 in display 14. For example, driver circuitry 18 may receive clock signals and other control signals from display driver integrated circuit 16 and may, in response to the received signals, assert scan signals and an emission signal in each row of display pixels 22. Rows of display pixels 22 may be processed in sequence, with processing for each frame of image data starting at the top of the array of display pixels and ending at the bottom of the array (as an example). While the scan lines in a row are being asserted, control signals and data signals that are provided to column driver circuitry 20 by circuitry 16 direct circuitry 20 to demultiplex and drive associated data signals D onto data lines 26 so that the display pixels in the row will be programmed with the display data appearing on the data lines D. The display pixels can then display the loaded display data.

Figure 2:
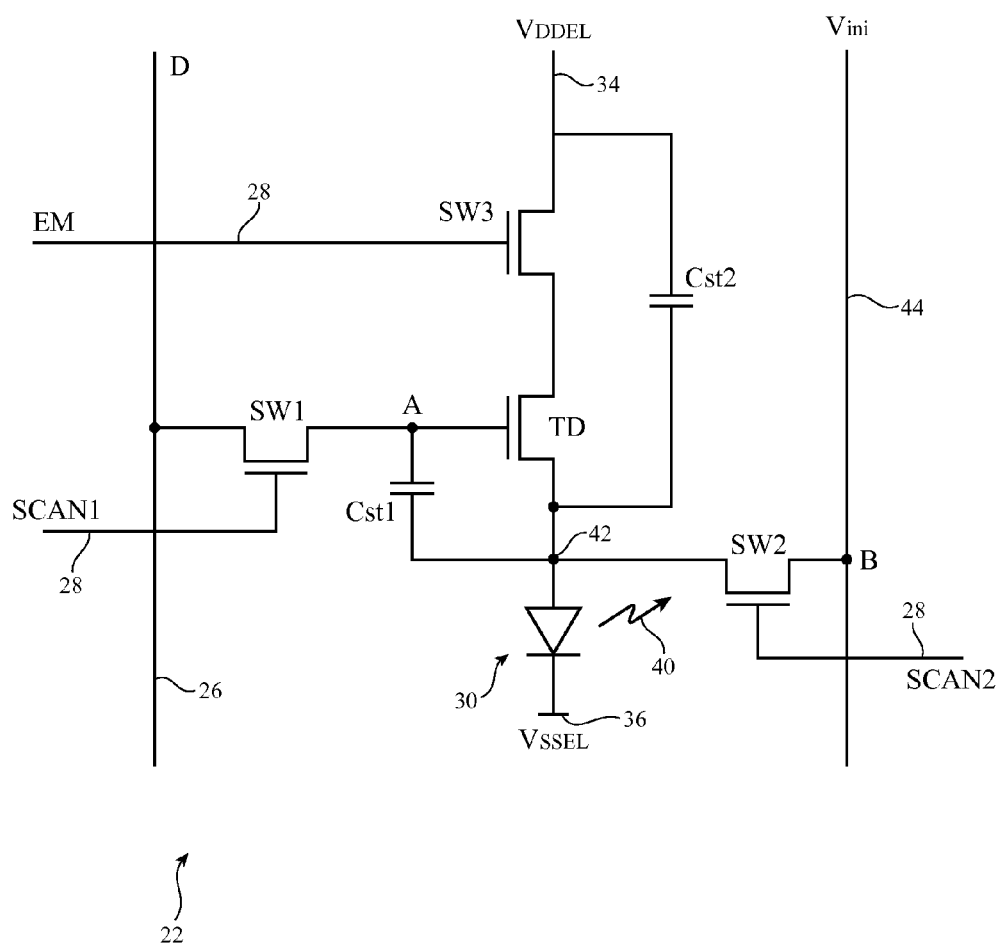
FIG. 2 is a diagram of an illustrative organic light-emitting diode display pixel of the type that may be used in a display in accordance with an embodiment.

Each pixel in an organic light-emitting diode display contains a respective organic light-emitting diode. A schematic diagram of an illustrative organic light-emitting diode pixel is shown in FIG. 2. As shown in FIG. 2, pixel 22 includes light-emitting diode 30. A positive power supply voltage Vddel may be supplied to positive power supply terminal 34 and a ground power supply voltage Vssel may be supplied to ground power supply terminal 36. The state of drive transistor TD controls the amount of current flowing through diode 30 and therefore the amount of emitted light 40 from pixel 22. Terminal 36 of diode 22 represents the cathode of diode 22. A blanket cathode layer may be used in display 14. The blanket cathode layer may overlap all of the pixels in display 14 (i.e., the cathode layer may be a layer that is shared by all pixels 22). The use of a common cathode layer in display 14 may help simplify fabrication. In addition to having a cathode, each diode 30 has a separate anode such as anode 42. Each anode in display 14 may be independently controlled, so that each diode 30 in display 14 can be independently controlled. This allows each pixel 22 to produce an independently controlled amount of light 40.

Display pixel 22 may have storage capacitors Cst1 and Cst2 and one or more transistors that are used as switches such as transistors SW1, SW2, and SW3. Signal EM and scan signals SCAN1 and SCAN2 are provided to a row of display pixels 22 using row lines 28. Data D is provided to a column of display pixels 22 via data lines 26.

Signal EN is used to control the operation of emission transistor SW3. Transistor SW1 is used to apply the voltage of data line 26 to node A, which is connected to the gate of drive transistor TD. Transistor SW2 is used to apply a direct current (DC) bias voltage Vini to node B for circuit initialization during compensation operations. Bias voltage Vini may be distributed across display 14 using paths such as bias voltage path 44. Bias voltage Vini may be −4.4 volts or other suitable voltage (e.g., a voltage lower than the ground voltage on the cathode).

During compensation operation, display pixels 22 are compensated for pixel-to-pixel variations such as transistor threshold voltage variations. The compensation period includes an initialization phase and a threshold voltage generation phase. Following compensation (i.e., after the compensation operations of the compensation period have been completed), data is loaded into the display pixels. The data loading process, which is sometimes referred to as data programming, takes place during a programming period. In a color display, programming may involve demultiplexing data and loading demultiplexed data into red, green, and blue pixels.

Following compensation and programming (i.e., after expiration of a compensation and programming period), the display pixels of the row may be used to emit light. The period of time during which the display pixels are being used to emit light (i.e., the time during which light-emitting diodes 30 emit light 40) is sometimes referred to as an emission period.

During the initialization phase, circuitry 18 asserts SCAN1 and SCAN2 (i.e., SCAN1 and SCAN2 are taken high). This turns on transistors SW1 and SW2 so that reference voltage signal Vref and initialization voltage signal Vini are applied to nodes A and B, respectively. During the threshold voltage generation phase of the compensation period, signal EM is asserted and switch SW3 is turned on so that current flows through drive transistor TD to charge up the capacitance at node B. As the voltage at node B increases, the current through drive transistor TD will be reduced because the gate-source voltage Vgs of drive transistor TD will approach the threshold voltage Vt of drive transistor TD. The voltage at node B will therefore go to Vref-Vt. After compensation (i.e., after initialization and threshold voltage generation), data is programmed into the compensated display pixels. During programming, emission transistor SW3 is turned off by deasserting signal EM and a desired data voltage D is applied to node A using data line 26. The voltage at node A after programming is display data voltage Vdata. The voltage at node B rises because of coupling with node A. In particular, the voltage at node B is taken to Vref-Vt+(Vdata-Vref)*K, where K is equal to Cst1/(Cst1+Cst2+Coled), where Coled is the capacitance associated with diode 30.

After compensation and programming operations have been completed, the display driver circuitry of display 14 places the compensated and programmed display pixels into the emission mode (i.e., the emission period is commenced). During emission, signal EM is asserted for each compensated and programmed display pixel to turn on transistor EM3. The voltage at node B goes to Voled, the voltage associated with diode 30. The voltage at node A goes to Vdata+(Voled−(Vref-Vt)−(Vdata-Vref)*K. The value of Vgs-Vt for the drive transistor is equal to the difference between the voltage Va of node A and the voltage Vb of node B. The value of Va-Vb is (Vdata-Vref)*(1-K), which is independent of Vt. Accordingly, each pixel 22 has been compensated for threshold voltage variations so that the amount of light 40 that is emitted by each of the pixels 22 in the row is proportional only to the magnitude of the data signal D for each of those pixels.

Each diode 30 in display 14 has layers of material interposed between cathode 36 and anode 42. These layers may include a hole layer (e.g., a hole injection layer and a hole transport layer), an electron layer (e.g., an electron injection layer and an electron transport layer), a layer of emissive material (e.g., organic electroluminescent material), and optionally one or more additional layers of material. The emissive material may be different for the diodes for pixels of different colors. For example, red diodes may have red emissive material, green diodes may have green emissive material, and blue diodes may have blue emissive material. Because the diodes associated with pixels of different colors contain emissive layers of different colors, separate evaporation masks are used to deposit the emissive material of each color. To simplify fabrication, the hole layer and the electron layer may be deposited as blanket films that are common to all diodes in display 14.

The anode of each diode is separate, but the presence of common diode layers such as the common hole layer serves as a potential path for lateral leakage currents between adjacent diodes. Lateral leakage currents can be suppressed by providing a path that sinks lateral leakage currents. The path that sinks the leakage currents can be formed from one of the conductive paths associated with operating pixels 22. As an example, a conductive path such as bias voltage path 44 (FIG. 2) may serve as a lateral leakage current sinking path. Bias voltage path 44 may have a voltage (e.g., a negative voltage) that draws laterally flowing leakage current downward out of the hole layer and thereby prevents the laterally flowing leakage current from disrupting operation of the diodes in adjacent pixels.

Figure 3:
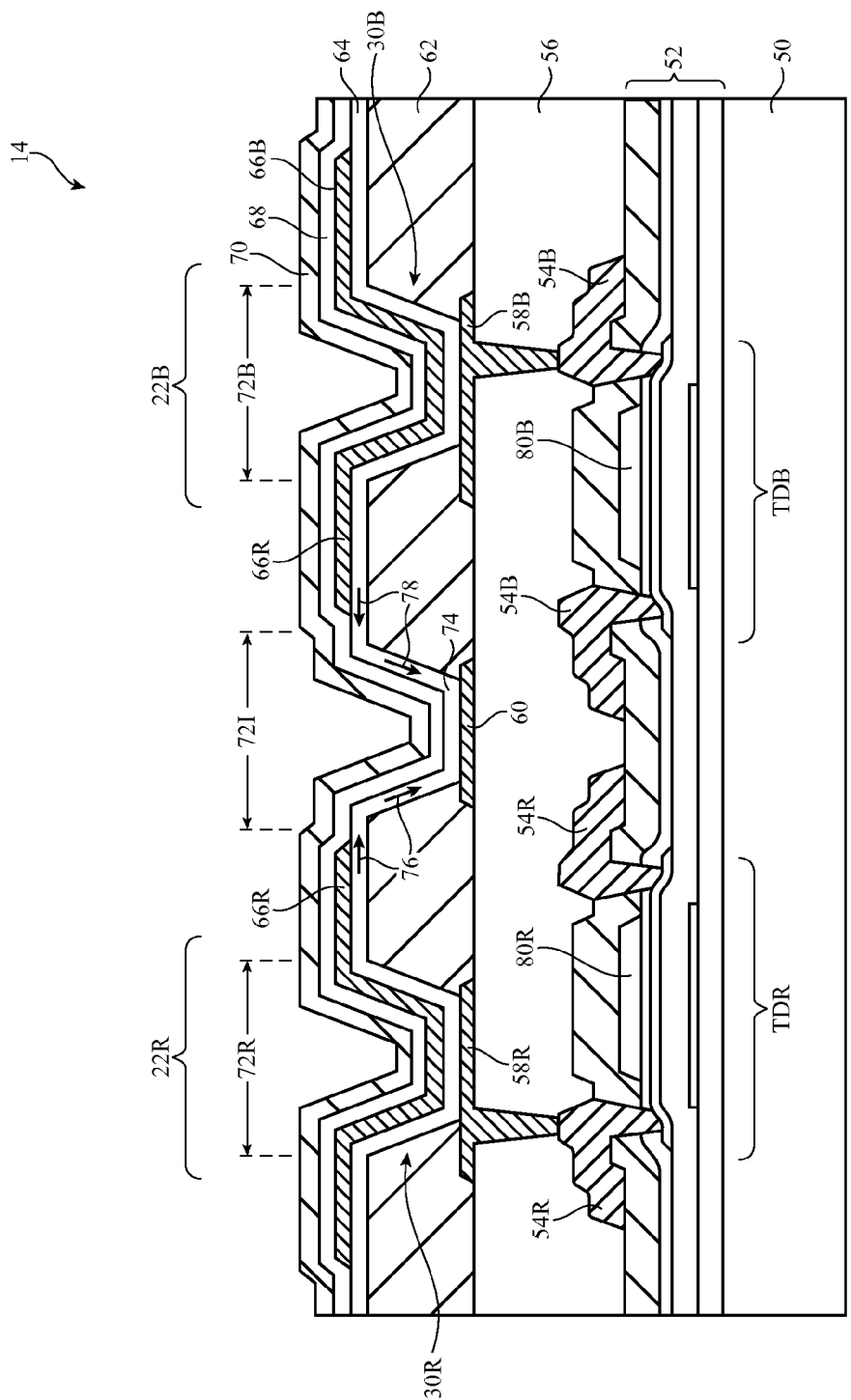
FIG. 3 is a cross-sectional side view of an illustrative organic light-emitting diode display in accordance with an embodiment.

A cross-sectional side view of illustrative structures that may be used in forming diodes 30 is shown in FIG. 3. Numerous diodes 30 are used in forming display 14. Two illustrative adjacent pixels and two associated diodes are shown in FIG. 3. Red pixel 22R is based on red diode 30R. Blue pixel 22B is based on blue diode 30B. Thin-film transistor circuitry 52 (see, e.g., the pixel circuitry of FIG. 2) is formed on substrate 50. Substrate 50 may be a layer of glass, plastic, or other material. Thin-film transistor circuitry 52 may be based on silicon thin-film transistors, indium gallium zinc oxide transistors or other semiconducting oxide transistors, or other thin-film transistor circuitry.

Thin-film transistor circuitry 52 may include drive transistors TDR and TDB (e.g., drive transistors such as drive transistor TD of FIG. 2). Drive transistor TDR is used to supply current to anode 58R of red diode 30R. Drive transistor TDB is used to supply current to anode 58B of blue diode 30B. Transistor TDR has terminals such as source-drain terminals 54R and gate terminal 80R. Transistor TDB has terminals such as source-drain terminals 54B and gate terminal 80B.

Dielectric planarization layer 56 may cover transistors such as transistors TDR and TBD in thin-film transistor circuitry 52. Planarization layer 56 may include a layer of inorganic material (e.g., silicon nitride) covered with a layer of polymer material (e.g., photoimageable polymer such as photoimageable acrylic) or other dielectric materials.

Anode 58R for red diode 30R and anode 58B for blue diode 30B may be formed on the surface of planarization layer 56. Openings in planarization layer 56 allow anodes 58R and 58B to be shorted to source-drain terminals 54R and 54B in transistors TDR and TDB, respectively. A conductive layer such as a layer of metal or other conductive material may be used in forming anodes 58R and 58B. The conductive layer may be patterned to form separate anodes for the diodes of pixels 22 such as anodes 58R and 58B. Portions of the conductive layer such as portion 60 may also be used to form a current sink structure that draws away lateral leakage current from the red and blue diodes. In the illustrative arrangement of FIG. 3, current sink path 60 has been formed from part of the same conductive layer that is used in forming anodes 58R and 58B. Path 60 may be shorted to bias voltage Vini on path 44 of FIG. 2 (i.e., path 60 of FIG. 3 may form part of path 44 of FIG. 2).

Red diode 30R of red pixel 22R has red emissive layer 66R. Blue diode 30B of blue pixel 22B has blue emissive layer 66B. The red emissive material of layer 66R and the blue emissive material of layer 66B are preferably separate from each other. During fabrication, layer 66R and layer 66B may be deposited by evaporating separate red and blue emissive materials through respective red and blue masks. Green emissive material (not shown in FIG. 3) is deposited through a mask in alignment with a drive transistor and diode structures for a green diode in a green pixel. The use of separate masks to deposit layers 66R and 66B allows the emissive materials for the red and blue diodes to be patterned separately, but adds process complexity.

To help minimize process complexity, the diode layers other than the colored emissive layers are preferably deposited using blanket layers of material (e.g., layers of material that are common to the diodes of all pixels 22 and that cover all of display 14). As shown in FIG. 3, for example, display 14 may have blanket (common) layers such as common hole layer 64 under emissive layers 66R and 66B, common electron layer 68 covering the emissive layers, and common cathode layer 70. Cathode layer 70 forms a common cathode terminal (see, e.g., cathode terminal 36 of FIG. 2) for all diodes in display 14. Cathode layer 70 may be formed form a transparent conductive material (e.g., indium tin oxide, a metal layer(s) that is sufficiently thin to be transparent, a combination of a thin metal and indium tin oxide, etc.). Electron layer 68 may include layers such as an electron injection layer and electron transport layer. Hole layer 64 may include layers such as a hole injection layer and a hole transport layer.

Pixel definition layer 62 may be formed on top of planarization layer 56. Pixel definition layer 62 may be formed from a polymer such as black photoimageable polyimide or other polymer. Pixel definition layer 62 may be formed on top of the anode layer (e.g., anodes 58R and 58B, and bias voltage conductor 60). Openings may be formed in pixel definition layer 62 to allow the common layers to contact anodes 58R and 58B. For example, in pixel 22R, pixel definition layer 62 may have opening 72R to allow electron layer 64 and the layers stacked above layer 64 to contact anode 58R. During operation of red pixel 22R, current flows from anode 58R vertically upwards through the stacked layers of diode 30R to cathode 70. Similarly, in pixel 22B, pixel definition layer 62 may have opening 72B to allow electron layer 64 and the layers stacked above layer 64 to contact anode 58B. During operation of blue pixel 22B, current flows from anode 58B vertically upwards through the stacked layers of diode 30B to cathode 70.

Ideally, adjacent diodes 30 in display 14 such as diodes 30R and 30B of FIG. 3 operate independently. In practice, the presence of common layers such as hole layer 64 present an opportunity for leakage current from one diode to flow laterally into an adjacent diode, thereby potentially disrupting the adjacent diode. For example, there is a possibility that the process of applying a drive current to the blue diode between anode 58B and cathode 70 in blue pixel 22B will give rise to lateral leakage current through layer 64 (e.g., a current from anode 58B to anode 58R) that could enter diode 30R of red pixel 22R and thereby inadvertently turn on the red diode and create light in the red pixel. This potential for interference between adjacent diodes can be reduced or eliminated by shorting hole layer 64 to bias path (electrode) 60 though portion 74 of hole layer 64.

The drive voltages on the anodes of display 14 may, as an example, range from about 2 volts (when a given pixel is dark) to 5 volts (when a given pixel is driven at its maximum intensity). Bias voltage Vini on bias path 60 may, as an example, have a negative voltage such as a voltage of −4.4 volts (or other suitable voltage level). Cathode 70 may be maintained at a voltage of 0 volts or other suitable ground voltage.

In this type of configuration, bias path (bias voltage path) 60 can block lateral leakage currents. In particular, when bias path 60 is laterally interposed between adjacent anodes such as anodes 58R and 58B, any leakage current that is flowing in hole layer 64 from anode 58B will be drawn downward into bias path 60 (due to the negative voltage of path 60), rather than continuing laterally into the adjacent diode (which is at 2 volts or higher). For example, lateral leakage current 78 from anode 58B in blue diode 30B may be drawn into bias path 60 when blue diode 30B is being operated and lateral leakage current 78 from anode 58R in red diode 30R may be drawn into bias path 60 when red diode 30R is being operated.

Figure 4:
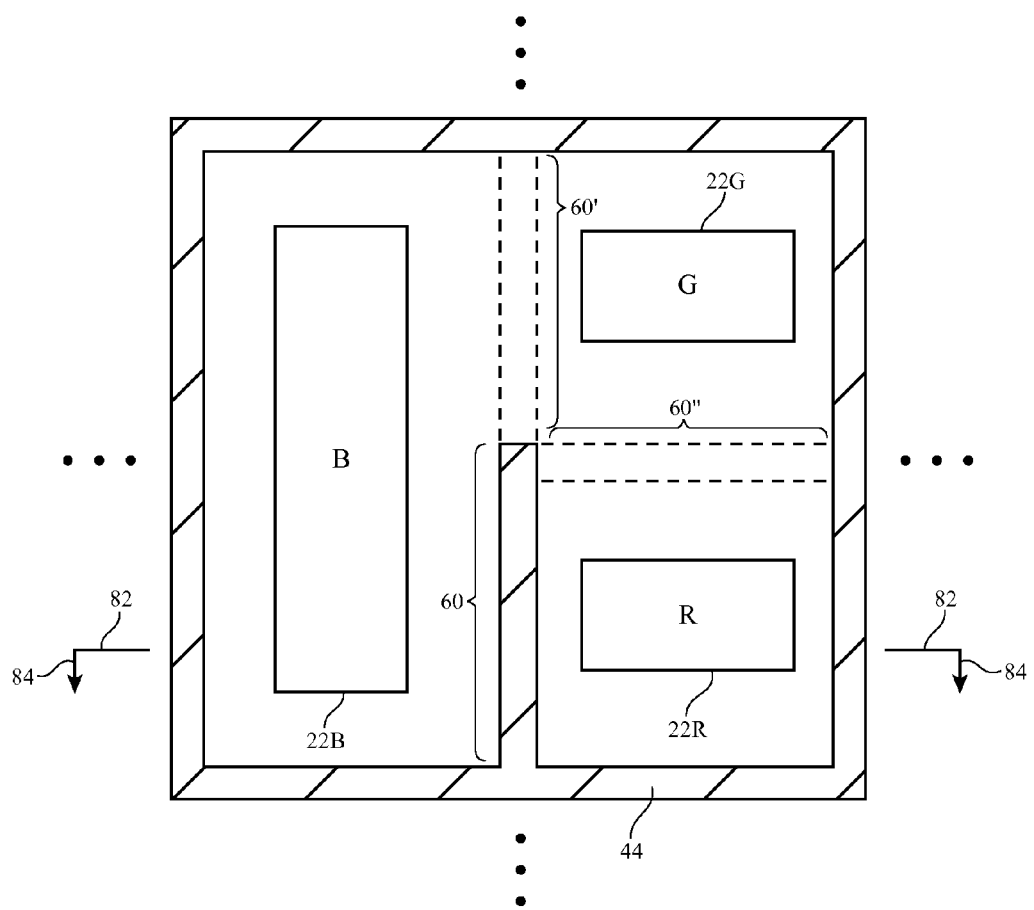
FIG. 4 is a top view of a set of pixels in an organic light-emitting diode display in accordance with an embodiment.

A top view of a set of red, blue, and green pixels 22 for display 14 is shown in FIG. 4. The set of pixels shown in FIG. 4 may be tiled across the surface of display 14 (i.e., the set of pixels may be arranged in rows and columns as shown in FIG. 1). Bias path 44 may have a grid pattern including portions that surround each set of red, blue, and green pixels, as shown in FIG. 4. To block lateral leakage currents that may disrupt the operation of adjacent pixels, at least some portions of bias path 44 extend between adjacent pixels. Portion 60 of bias path 44 may, for example, be interposed between blue pixel 22B and red pixel 22R, as shown in FIG. 4. FIG. 3 is a cross-sectional side view of display 14 of FIG. 4 taken along line 82 and viewed in direction 84. As described in connection with the cross section of FIG. 3, the presence of a current sink path such as bias path 60 between anode 58B of blue pixel 22B and anode 58R of red pixel 22R draws lateral leakage current 78 from blue diode 30B into path 60 and draws lateral leakage current 76 from red diode 30R into path 60. The presence of path 60 therefore helps isolate the blue and red pixels of FIG. 4.

Red pixels may be particularly sensitive to interference from adjacent pixel leakage and blue pixels tend to be driven strongly, so, if desired, path 60 between adjacent red and blue pixels may be the only isolation path that is formed. If desired, additional isolation path extensions to bias path 44 may be formed. For example, path 60" may be formed between green pixel 22G and red pixel 22R to isolate the green and red pixels from each other and path 60' may be formed between blue pixel 22B and green pixel 22G to isolate the blue and green pixels from each other. In displays with pixels of other colors, additional isolation paths may be formed. The configuration of FIG. 4 in which the red and blue pixels are isolated using path 60 is merely illustrative.

Figure 5:
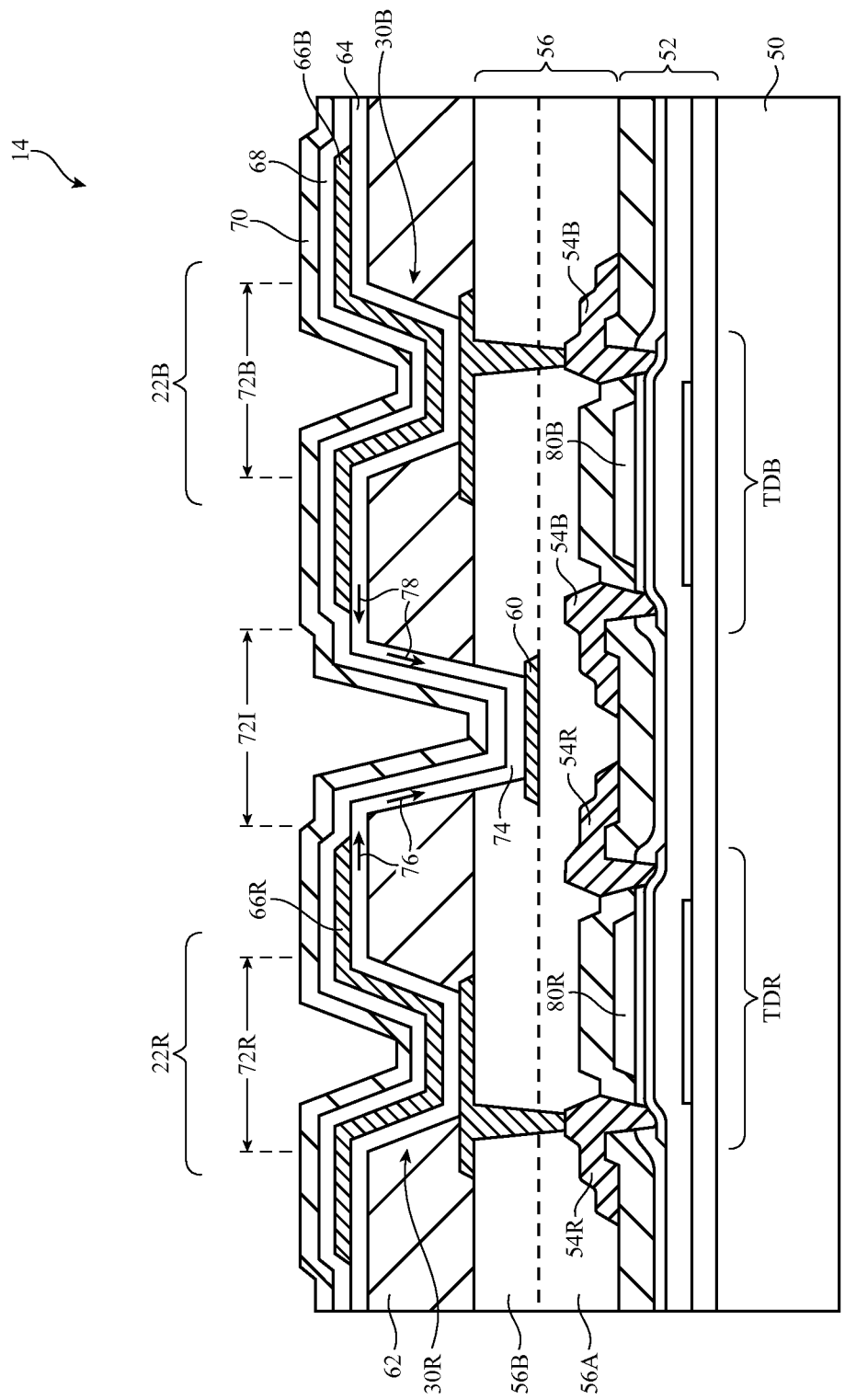
FIG. 5 is a cross-sectional side view of another illustrative organic light-emitting diode display in accordance with an embodiment.

If desired, isolation path 60 may be formed using a layer of metal that is embedded within planarization layer 56, as shown in FIG. 5. This type of arrangement may make it possible to enhance the aperture ratio for pixels 22, because the placement of path 60 within layer 56 allows anode spacing to be minimized. As shown in FIG. 5, planarization layer 56 may have a first dielectric layer such as dielectric layer 56A and a second dielectric layer such as dielectric layer 56B. Layer 56A may be an inorganic dielectric layer such as a layer of silicon nitride or may be other suitable dielectric. Layer 56B may be an organic dielectric layer such as a layer of photoimageable acrylic or other suitable dielectric. During fabrication, a metal layer may be deposited and patterned on layer 56A to form isolation path 60 and other portions of bias path 44 (FIGS. 2 and 4). Layer 56B may then be deposited, thereby embedding path 60 within the dielectric material of planarization layer 56. Planarization layer 56 can be patterned before or after deposition of pixel definition layer and the formation of opening 72I in pixel definition layer to form an opening for portion 74 of hole layer 64. After depositing layers 64, emissive layers 66R and 66B, layer 68, and layer 70, portion 74 will contact path 60 and short layer 64 to path 60, as described in connection with FIG. 3.

The foregoing is merely illustrative and various modifications can be made by those skilled in the art without departing from the scope and spirit of the described embodiments. The foregoing embodiments may be implemented individually or in any combination.

What is claimed is:

1. A display comprising:
    an array of pixels, each pixel having a respective organic light-emitting diode and a pixel circuit, wherein the pixel circuits include a bias path and wherein a portion of the bias path is interposed between first and second pixels;
    a common hole layer that forms part of each of the organic light-emitting diodes in the array of pixels; and
    a pixel definition layer having an opening through which the common hole layer is shorted to the portion of the bias path that is interposed between the first and second pixels.

2. The display defined in claim 1 wherein the common hole layer comprises a hole injection layer and a hole transport layer.

3. The display defined in claim 2 wherein the first pixel comprises a red pixel and wherein the second pixel comprises a blue pixel.

4. The display defined in claim 3 wherein the red pixel and blue pixel have respective anodes and wherein the bias path comprises a portion of a layer of material that forms the anodes.

5. The display defined in claim 4 further comprising:
    a substrate; and
    thin-film transistor circuitry for the pixel circuits, wherein the thin-film transistor circuitry is formed on the substrate.

6. The display defined in claim 5 further comprising:
    a dielectric layer on the thin-film transistor circuitry, wherein the anodes and the bias path are formed on the dielectric layer.

7. The display defined in claim 6 wherein the organic light-emitting diodes have a common cathode that is maintained at a first voltage and wherein the bias path is maintained at a second voltage that is less than the first voltage.

8. The display defined in claim 3 wherein the red pixel and blue pixel have respective anodes formed from a layer of material and wherein the bias path comprises a portion of a layer of material other than the layer of material that forms the anodes.

9. The display defined in claim 3 further comprising:
    a substrate;
    thin-film transistor circuitry for the pixel circuits, wherein the thin-film transistor circuitry is formed on the substrate; and a dielectric layer on the thin-film transistor circuitry, wherein the anodes are formed on a surface of the dielectric layer and wherein the bias path is embedded within the dielectric layer.

10. The display defined in claim 9 wherein the organic light-emitting diodes have a common cathode that is maintained at a first voltage and wherein the bias path is maintained at a second voltage that is less than the first voltage.

11. The display defined in claim 2 wherein each organic light-emitting diode has an emissive layer on the hole layer.

12. The display defined in claim 11 wherein the emissive layers include red emissive layers, green emissive layers, and blue emissive layers.

13. The display defined in claim 12 wherein the organic light-emitting diodes share a common electron layer that has an electron injection layer and an electron transport layer and wherein the emissive layer of each organic light-emitting diode is interposed between the common electron layer and the common hole layer.

14. The display defined in claim 2 wherein the bias path is coupled to an anode through a transistor.

15. An organic light-emitting diode display comprising:
organic light-emitting diodes having a common cathode layer, a common electron layer, and a common hole layer;
anodes each of which is associated with a respective one of the organic light-emitting diodes; and
a metal path in contact with the common hole layer, wherein a portion of the metal path is laterally interposed between first and second adjacent diodes in the organic light-emitting diodes.

16. The organic light-emitting diode display defined in claim 15 wherein the first and second adjacent diodes have first and second respective anodes, wherein the display comprises a dielectric layer, wherein the first and second anodes are formed on the dielectric layer, and wherein the metal path is formed on the dielectric layer between the first and second anodes.

17. The organic light-emitting diode display defined in claim 15 wherein the first and second adjacent diodes have first and second respective anodes, wherein the display comprises a dielectric layer, wherein the first and second anodes are formed on the dielectric layer, and wherein the metal path is embedded within the dielectric layer at a location that is laterally interposed between the first and second anodes.

18. The organic light-emitting diode display defined in claim 15 wherein the organic light-emitting diodes include a plurality of sets of light-emitting diodes each of which has a red diode, a blue diode, and a green diode and wherein the metal path is interposed between a red diode and a blue diode in a given one of the sets of light-emitting diodes and does not have any portions interposed between the green diode and the blue diode in that given set.

19. An organic light-emitting diode display comprising:
a plurality of organic light-emitting diodes having a common cathode layer, a common electron layer, a common hole layer, and respective individual anodes; and
a metal structure shorted to the common hole layer that prevents lateral leakage current from flowing between first and second diodes in the plurality of organic light-emitting diodes by sinking the lateral leakage current.

20. The organic light-emitting diode display defined in claim 19 wherein the plurality of organic light-emitting diodes include red diodes having red emissive layers between the common electron layer and the common hole layer, green diodes having green emissive layers between the common electron layer and the common hole layer, and blue diodes having blue emissive layers between the common electron layer and the common hole layer and wherein the first diode is one of the red diodes and the second diode is one of the blue diodes.

* * * * *